US012610452B2

(12) United States Patent
Tewari et al.

(10) Patent No.: US 12,610,452 B2

(45) Date of Patent: Apr. 21, 2026

(54) MICROFLUIDIC PRINTED CIRCUIT BOARD COOLING

(71) Applicant: Microsoft Technology Licensing, LLC, Redmond, WA (US)

(72) Inventors: Shubhangi Tewari, Redmond, WA (US); Bharath Ramakrishnan, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 127 days.

(21) Appl. No.: 18/522,955

(22) Filed: Nov. 29, 2023

(65) Prior Publication Data

US 2025/0176095 A1 May 29, 2025

(51) Int. Cl.
| | |
|---|---|
| *H05K 1/02* | (2006.01) |
| *H05K 3/46* | (2006.01) |
| *H05K 7/20* | (2006.01) |

(52) U.S. Cl.
CPC ......... H05K 1/0212 (2013.01); H05K 1/0272 (2013.01); H05K 3/4688 (2013.01); H05K 7/20327 (2013.01); *H05K 2201/064* (2013.01)

(58) Field of Classification Search
CPC ...... H05K 1/0212; H05K 1/0272; H05K 1/02; H05K 2201/064; H05K 3/4688; H05K 3/46; H05K 7/20327; H05K 7/20; H05K 2201/10121; H05K 2201/10151; H05K 3/4697; B01L 2200/147; B01L 2300/0645; B01L 2300/0654; B01L 2300/0816; B01L 2300/0887; B01L 2300/1827; B01L 3/502707; B01L 3/502715; B01L 7/52; G01N 21/64

USPC .............. 174/250; 427/96.4; 435/305.2, 91.2
See application file for complete search history.

(56) References Cited

U.S. PATENT DOCUMENTS

| | | |
|---|---|---|
| 7,327,570 B2 | 2/2008 | Belady |
| 10,660,199 B1 | 5/2020 | Flowers et al. |
| 11,445,628 B1 * | 9/2022 | Clarkson .............. H05K 5/0095 |

(Continued)

OTHER PUBLICATIONS

Embedded Microfluidic Cooling with Compact Double H-type Manifold_Yang et al. 1 to Aug. 17, 2022.*

(Continued)

*Primary Examiner* — Timothy J Thompson
*Assistant Examiner* — Guillermo J Egoavil
(74) *Attorney, Agent, or Firm* — Holzer Patel Drennan

(57) ABSTRACT

Printed circuit boards (PCBs) are a fundamental component used in nearly all electronics. PCBs provide electrical connections and mechanical support to electronic components and are generally made of copper layers laminated onto, through, and/or between one or more non-conductive substrate layers. The presently disclosed technology is directed to microfluidic cooling systems for PCBs. Such systems may be used to alleviate thermal issues caused by continuous operation of high-power components on PCB boards with high-current density signals and fast switching power supplies, for example, all of which generate substantial quantities of thermal energy to dissipate. A microfluidic pump is connected in line with the network of microfluidic passages. The microfluidic pump flows a coolant fluid through the network of microfluidic passages to cool heat-generating components on the PCB.

20 Claims, 4 Drawing Sheets

(56)            References Cited

U.S. PATENT DOCUMENTS

| 2015/0182967 A1* | 7/2015 | Coursey ........... B01L 3/502707 |
| | | 427/96.4 |
| 2020/0137885 A1* | 4/2020 | Flowers ................. H01B 7/423 |

OTHER PUBLICATIONS

Thermally Controlled Micofluidic Back Pressure Regulator_
Svensson et al._ 1 to Jan. 11, 2022.*

* cited by examiner

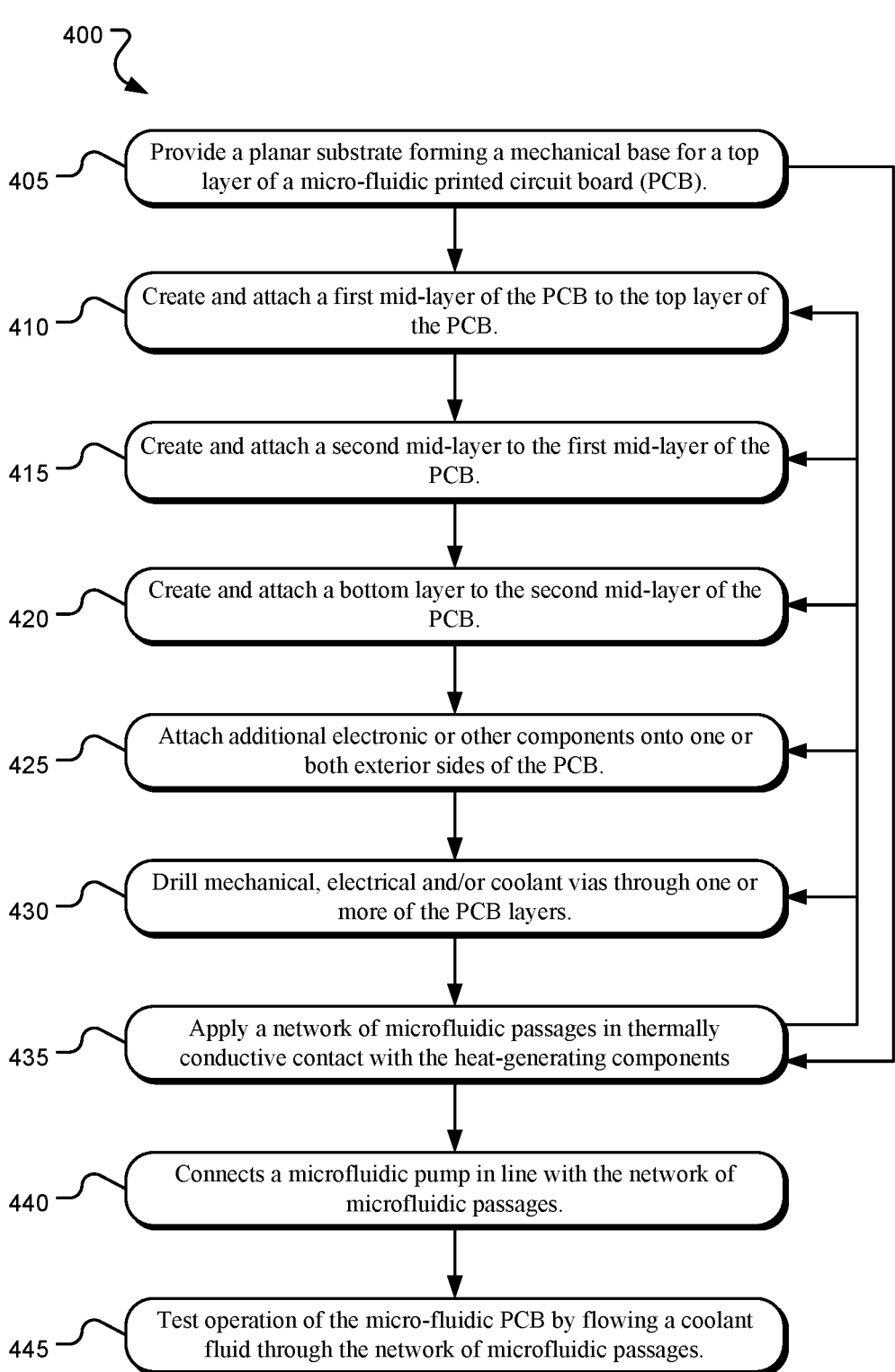

400

405 — Provide a planar substrate forming a mechanical base for a top layer of a micro-fluidic printed circuit board (PCB).

410 — Create and attach a first mid-layer of the PCB to the top layer of the PCB.

415 — Create and attach a second mid-layer to the first mid-layer of the PCB.

420 — Create and attach a bottom layer to the second mid-layer of the PCB.

425 — Attach additional electronic or other components onto one or both exterior sides of the PCB.

430 — Drill mechanical, electrical and/or coolant vias through one or more of the PCB layers.

435 — Apply a network of microfluidic passages in thermally conductive contact with the heat-generating components 440 — Connects a microfluidic pump in line with the network of microfluidic passages.

445 — Test operation of the micro-fluidic PCB by flowing a coolant fluid through the network of microfluidic passages.

FIG. 4

MICROFLUIDIC PRINTED CIRCUIT BOARD COOLING

BACKGROUND

A printed circuit board (PCB) mechanically supports and electrically interconnects an array of electronic components using conductive traces, vias, and other features etched from metallic sheets laminated onto a non-conductive substrate. Typically, the PCB is a laminated sandwich structure of conductive and insulating layers. Each of the conductive layers include artwork pattern of traces, planes and other features etched from one or more sheet layers of copper laminated onto and/or between the insulating layers.

SUMMARY

Implementations described and claimed herein provide a microfluidic printed circuit board (PCB). The PCB includes a first layer, such as a ground layer including a network of ground traces and/or a planes, a second layer, such as a power layer including a network of power traces and/or planes, and a third layer, such as a signal layer including a network of signal traces and/or planes. The PCB may further include one or more heat-generating components attached to the microfluidic PCB. A network of microfluidic passages is applied to one or more of the first, second, and third layers (or the ground layer, the power layer, and the signal layer) and in thermally conductive contact with the heat-generating components. The network of microfluidic passages is further electrically isolated from the ground traces, power traces, and signal traces. A microfluidic pump is connected in line with the network of microfluidic passages. The microfluidic pump flows a coolant fluid through the network of microfluidic passages to cool the heat-generating components.

Other implementations are also described and recited herein. This Summary is provided to introduce a selection of concepts in a simplified form that are further described below in the Detailed Descriptions. This Summary is not intended to identify key features or essential features of the claimed subject matter, nor is it intended to be used to limit the scope of the claimed subject matter.

BRIEF DESCRIPTION OF THE DRAWINGS

FIG. 4 illustrates example operations for manufacturing a microfluidic PCB.

DETAILED DESCRIPTIONS

Figure 1:
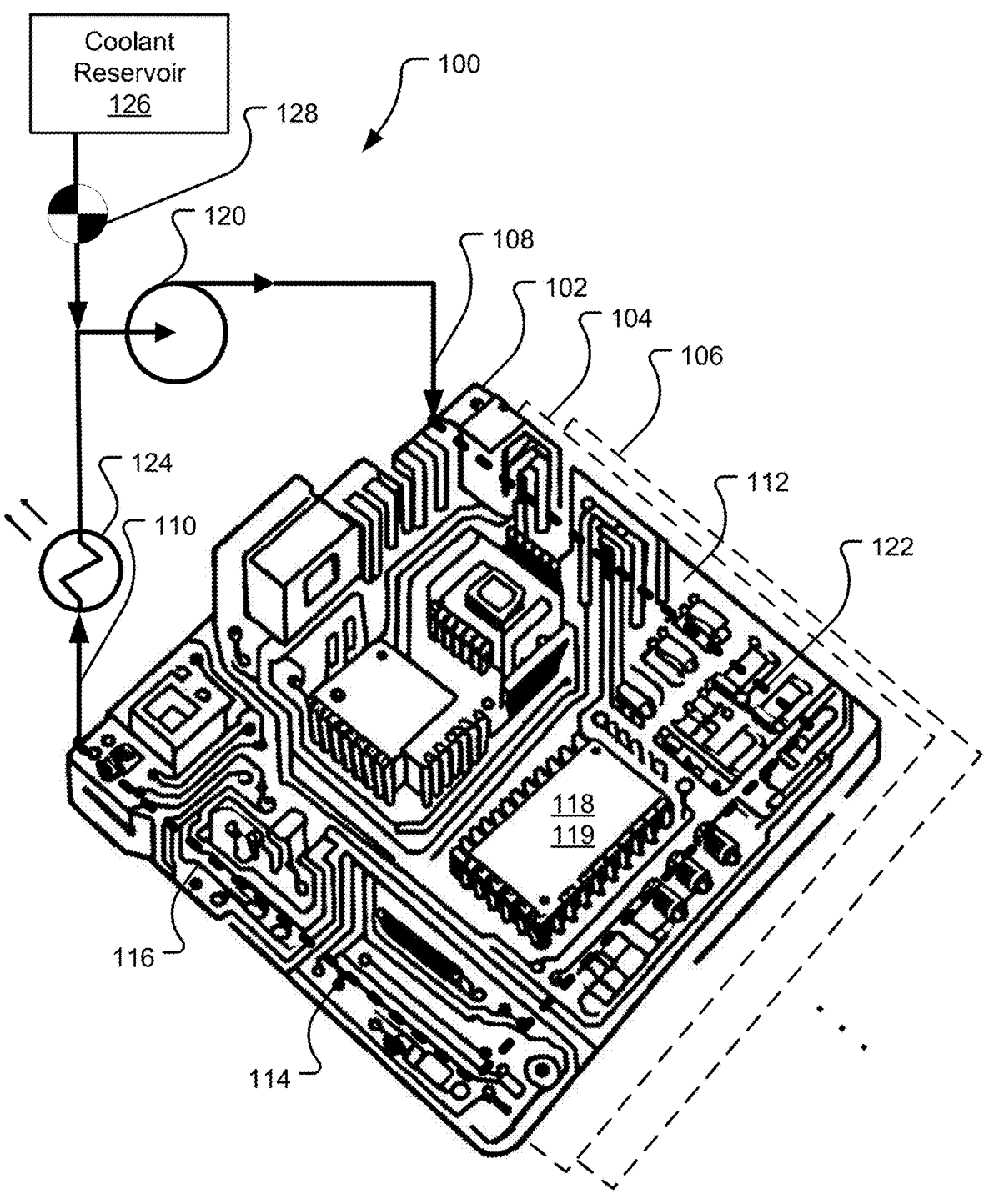
FIG. 1 illustrates an example common microfluidic cooling system for a stack of microfluidic printed circuit boards (PCBs).

Printed circuit boards (PCBs) are a fundamental component used in nearly all electronics. PCBs provide electrical connections and mechanical support to electronic components and are generally made of copper layers laminated onto, through, and/or between one or more non-conductive substrate layers. The copper layers are etched with traces and other features to create electrical connections for the electronic components. Vias are formed through the non-conductive substrate layers to connect electronic components on opposing sides of the substrate layer(s). PCBs can be single-sided (including one copper layer on a substrate layer), double-sided (including two copper layers, one on each side of the substrate layer), or multi-layer (including outer and inner layers of copper, alternating with substrate layers). Multi-layer PCBs allow for much higher component density because circuit traces may primarily occupy on the inner layers, which frees up surface space on the outer layers for mounting electronic components.

The presently disclosed technology is directed to microfluidic cooling systems for PCBs. Such systems may be used to alleviate thermal issues caused by continuous operation of high-power components on PCB boards with high-current density signals and fast switching power supplies, all of which generate substantial quantities of thermal energy to dissipate. Such technology may be useful in datacenters as numerous heat-generating PCBs may be present and a common microfluidic cooling system, such as microfluidic cooling system 100 of FIG. 1, discussed below, could circulate coolant from the PCBs using a shared cooling system components, such as pumps, heat exchangers, and coolant reservoirs.

The microfluidic printed circuit boards PCBs may include microfluidic channel traces similar to electrical signal traces of any length and width. One or more pumps (external or mounted on an outer layer of the PCB) push fluid through these microfluidic channels to cool the PCB. Hardware engineers can route microfluidic channels on PCB boards through multiple layers and occupying various spaces on the PCB, similar to how electrical paths are routed. More specifically, PCBs today are developed using tools such as Cadence and Altium. These tools typically have two features: 1) Schematic, which is the electrical drawing of the system; and 2) Layout, which is the physical arrangement of the components on the PCB. The presently disclosed technology may utilize a same or similar Layout feature, which can allow designers to route microfluidic channels concurrently with electrical traces, via, and electronic components and other components (e.g., integrated pumps or heat exchangers) on a PCB as per their application and the actual arrangement of the channels on the board integrated with.

The presently disclosed microfluidic PCB designs may reduce or eliminate the need for external thermal management add-ons such as heat sinks, thermal pastes, etc. to alleviate thermal issues caused by over-heating of components on a PCB. The presently disclosed microfluidic PCB designs are user-adaptive, which allows a design engineer to route microfluidic channels per their specific application. For example, a hardware engineer working on a power supply PCB may focus on routing channels around high di/dt loops whereas a hardware engineer working on a network design of a datacenter PCB may focus on routing channels such that it alleviates thermal issues caused on network switches, matrix switches, etc. The presently disclosed microfluidic PCB designs may also be cheaper than applying cooling solutions directed to individual components. For example, a switching MOSEFT used to make a server power supply purchased at volume may cost more than a fabricated full microfluidic PCB board purchased at volume. In sum, mass manufacturing cooling technologies using a microfluidic PCB may be more economical than developing individual component-based cooling solutions.

FIG. 1 illustrates an example common microfluidic cooling system 100 for a stack of microfluidic printed circuit boards (PCBs) 102, 104, 106, each having an external coolant supply 108 and return 110. The PCBs 102, 104, 106 each include an insulating substrate (e.g., substrate 112, such as a woven fiberglass cloth with an epoxy resin binder) with a network of conductive vias (e.g., via 114), traces (e.g., trace 116) and/or other conductive paths or areas thereon. The PCBs 102, 104, 106 further each may include a variety of electronic components (e.g., electronic component 118) soldered to the network of conductive paths thereon to create a functional electrical network interconnecting the electronic components mounted on one or both sides of the respective substrate, as well as through the respective substrate. In various implementations, conductive paths on different sides of the PCBs 102, 104, 106 may be connected with the vias.

In various implementations, the electronic components may include capacitors, resistors, microprocessors, storage devices, etc. Further, the PCBs 102, 104, 106 further may each be single-sided (e.g., having one layer forming the conductive network), double-sided (e.g., having two conductive layers forming the conductive network,) or multi-layer (e.g., having inner and outer conductive layers forming the conductive network). Should one or more of the PCBs 102, 104, 106 be double-sided or multi-layer, the electronic components are soldered to the network of conductive paths on both sides, though only one side of one of the PCBs 102, 104, 106 (i.e., PCB 102) is illustrated in detail in FIG. 1. Various implementations described herein may be implemented on single-sided, double-sided, or multi-layer PCBs.

The number and arrangement of conductive traces, vias, planes, and other paths, as well as electronic components illustrated in FIG. 1 is an example only. Actual implementations of the presently disclosed technology may adopt nearly any possible arrangement of conductive traces, vias, planes, electronic components, and other possible components of a PCB. These conductive paths or areas are generally made of copper alloys (also referred to as simply copper herein), though other conductive materials are contemplated herein. Further, PCBs as referred to herein are defined as including any insulating substrate with a network of conductive paths formed thereon or therein. In various implementations, the PCBs 102, 104, 106 may include ceramics, fiberglass, plastics (e.g., flexible polymers), or any combination thereof. For example, any one or more of the PCBs 102, 104 may be flexible printed circuits ("FPCs") on a polyimide substrate.

Only the PCB 102 is illustrated in detail in FIG. 1, though PCBs 104, 106 may have the same or similar features as PCB 102. The other PCBs (e.g., PCBs 104, 106) are only shown in partial outline in FIG. 1 for clarity purposes. An ellipsis is provided to illustrate that while three PCBs 102, 104, 106 are shown in FIG. 1, greater or fewer PCBs may be connected to the microfluidic cooling system 100 at external coolant supply 108 and return 110. Further, external coolant ports (not shown, see e.g., coolant inlet port 354 and coolant outlet port 356 of FIG. 3) may be provided that individually connect each of the PCBs 102, 104, 106 to the microfluidic cooling system 100.

The microfluidic cooling system 100 includes an external pump 120 that serves to circulate fluid through a series of microfluidic channels running through each of the PCBs 102, 104, 106 (illustrated conceptually by thick dotted line 122) via the external coolant supply 108 and the return 110. Details regarding the microfluidic channels are provided below. An external heat exchanger 124 (e.g., liquid-to-air radiators, heat sinks, heat pipes, vapor chambers, etc.) may be provided in-line to remove thermal energy from the circulating coolant.

A coolant reservoir 126 may be provided within the microfluidic cooling system 100 to serve as a source of additional coolant (e.g., to replace coolant in the event of a leak) and/or to serve as a buffer for the circulated coolant. A valve 128 may control if, how, and when the coolant reservoir 126 is fluidly connected to the microfluidic cooling system 100. In some implementations, the coolant reservoir 126 may form part of the external heat exchanger 124 by diluting thermal energy into a much larger quantity of coolant as compared to the coolant contained within the microfluidic channels. In other implementations, the microfluidic cooling system 100 is a closed-loop with no coolant reservoir. The circulated coolant may be any low-viscosity fluid that can effectively be circulated through the series of microfluidic channels (e.g., water, ethylene glycol-based anti-freeze, light oils, etc.).

As an example, the electronic component 118 serves as a heat-generating component 119 that is attached to the PCB 102 and is to be cooled by the microfluidic cooling system 100. The series of microfluidic channels runs adjacent the electronic component 118 and makes thermally conductive contact with the electronic component 118 or runs close enough to the electronic component 118 to effectively transfer thermal energy from the electronic component 118 to coolant flowing through the microfluidic channels. While the series of microfluidic channels are thermally conductive with the electronic component 118, the network of microfluidic passages are electrically isolated from the electronic component 118 and other electrical components of the PCB 102, including ground traces/planes, power traces/planes, and signal traces/planes, for example.

Figure 2:
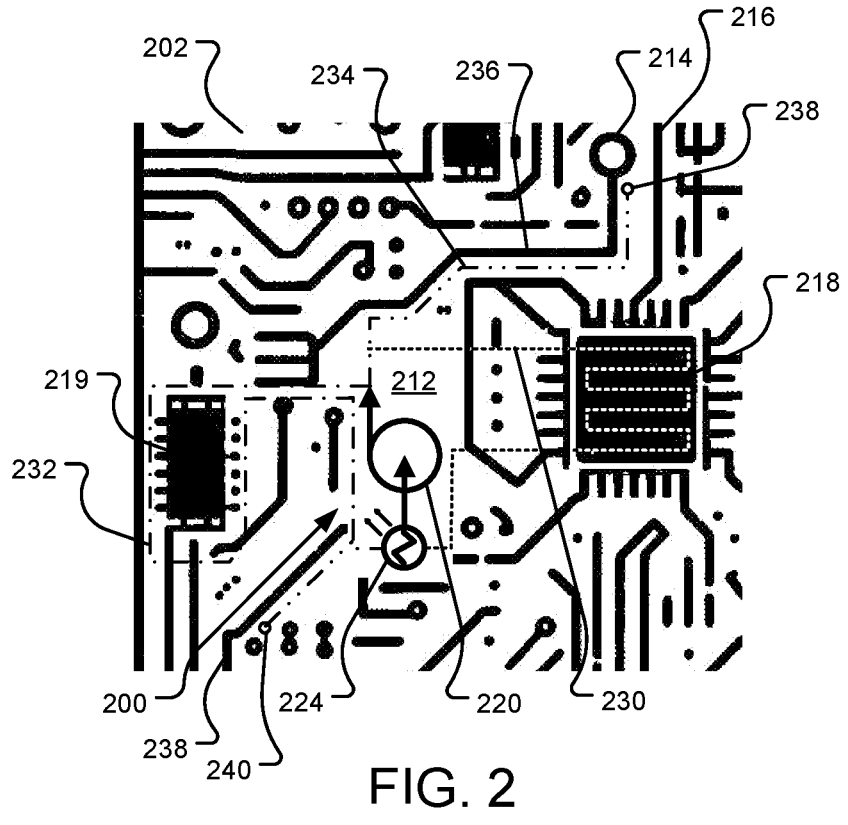
FIG. 2 illustrates a partial plan view of an example microfluidic PCB with an internal closed microfluidic cooling system.

FIG. 2 illustrates a partial plan view of an example microfluidic PCB 202 with an internal closed microfluidic cooling system 200. The PCB 202 include an insulating substrate 212 with a network of conductive vias (e.g., via 214), traces (e.g., trace 216) and/or other conductive paths or areas thereon. The PCB 202 further includes a variety of discrete electronic devices (e.g., electronic components 218, 219) soldered or otherwise attached to the network of conductive paths thereon to create a functional electrical network interconnecting the electronic components mounted on one or both sides of the substrate 212, as well as through the substrate 212, though only one exterior side of one of the PCB 202 is illustrated in detail in FIG. 2. In various implementations, conductive paths on different sides of the PCB 202 or within the PCB 202 may be connected with the vias. The number and arrangement of conductive traces, vias, and other paths, as well as electronic components illustrated in FIG. 2 is an example only. Actual implementations of the presently disclosed technology may adopt nearly any possible arrangement of conductive traces, vias, electronic components, and other possible components of a PCB.

The microfluidic cooling system 200 includes a pump 220 mounted to or within the PCB 202 that serves to circulate coolant fluid through a series of microfluidic channels running through the PCB 202 (illustrated conceptually by thin dotted, dot-dash, and dot-dot-dash lines). A heat exchanger 224 is also mounted to or within the PCB 202 and is in-line with the series of microfluidic channels to remove thermal energy from the circulating coolant. In some implementations, the heat exchanger 224 is omitted. The microfluidic cooling system 200 is illustrate as a closed-loop with no coolant reservoir, though other implementations may be open-loop with a coolant reservoir (see e.g., FIG. 1). The circulated coolant may be any low-viscosity fluid that can effectively be circulated through the series of microfluidic channels.

Three example microfluidic cooling loops 230, 232, 234 are illustrated in FIG. 2, each of which are output from the pump 220, make thermally conductive contact with a heat-generating component of the PCB 202, and subsequently return to the pump 220 to form a closed loop. The first microfluidic cooling loop 230 (illustrated by dotted lines) serves to cool electronic component 218 (e.g., a micropro-cessor). The microfluidic cooling loop 230 runs from the pump 220, back-and-forth beneath the electronic component 218 to maximize thermally conductive contact area with the electronic component 118, and then returns through the heat exchanger 224 to the pump 220.

The microfluidic cooling loop 230 runs in contact with or close enough beneath the electronic component 218 to effectively transfer thermal energy from the electronic com-ponent 218 to coolant flowing through the microfluidic cooling loop 230. While the microfluidic cooling loop 230 is thermally conductive with the electronic component 218, the microfluidic cooling loop 230 is electrically isolated from the electronic component 218 and other electrical components of the PCB 202, including ground traces, power traces, and signal traces, for example.

The second microfluidic cooling loop 232 (illustrated by dot-dash lines) serves to cool electronic component 219 (e.g., a data storage device). The microfluidic cooling loop 232 runs from the pump 220, around the electronic compo-nent 219 to maximize thermally conductive contact area with the electronic component 219, and then returns through the heat exchanger 224 to the pump 220. The microfluidic cooling loop 232 at least partially, if not nearly fully encircles the electronic component 219 to maximize ther-mally conductive contact area with the electronic component 219 (e.g., 90%+ encirclement). The microfluidic cooling loop 232 runs in contact with or close enough adjacent the electronic component 219 to effectively transfer thermal energy from the electronic component 219 to coolant flow-ing through the microfluidic cooling loop 232. While the microfluidic cooling loop 232 is thermally conductive with the electronic component 219, the microfluidic cooling loop 232 is electrically isolated from the electronic component 219 and other electrical components of the PCB 202, includ-ing ground traces, power traces, and signal traces, for example.

The third microfluidic cooling loop 234 (illustrated by dot-dot-dash lines) serves to cool high-current electrical traces 236, 238 (e.g., high-speed, high-current sense signal traces). The microfluidic cooling loop 234 runs from the pump 220, parallel and adjacent the trace 236 to maximize thermally conductive contact area with the trace 236, through microfluidic via 238 and out of view, internally through the PCB 202, through microfluidic via 240 and back from into view, parallel and adjacent the trace 238 (which may or may not be electrically contiguous with the trace 236), and then returns through the heat exchanger 224 to the pump 220.

The microfluidic cooling loop 234 parallels a substantial length of the traces 236, 238 in close proximity to maximize thermally conductive contact area with the traces 236, 238. The microfluidic cooling loop 234 further runs in contact with or close enough adjacent the traces 236, 238 to effec-tively transfer thermal energy from the traces 236, 238 to coolant flowing through the microfluidic cooling loop 234. While the microfluidic cooling loop 234 is thermally con-ductive with the traces 236, 238, the microfluidic cooling loop 234 is electrically isolated from the traces 236, 238 and other electrical components of the PCB 202, including electronic devices, ground traces, power traces, and signal traces, for example.

A number of cross-overs between the illustrated traces and the microfluidic cooling loops 230, 232, 234 are illus-trated in FIG. 2, though the microfluidic cooling loops 230, 232, 234 are generally electrically isolated from the illus-trated traces. This may be accomplished by running the illustrated traces and the microfluidic cooling loops 230, 232, 234 within different layers of the PCB 202 or utilizing insulating material around the microfluidic passages allows to permit physical contact with the traces without electrical connection. Such insulating material may also be used by the microfluidic cooling loops 230, 232, 234 to enable physical contact with the heat-generating components 218, 219 and traces 236, 238 to maximize thermal transfer without cre-ating an electrical connection. In some implementations, the microfluidic cooling loops 230, 232, 234 can be electrically connected with some of the traces, for example, when the traces and the microfluidic cooling loops 230, 232, 234 are commonly connected to electrical ground.

Figure 3:
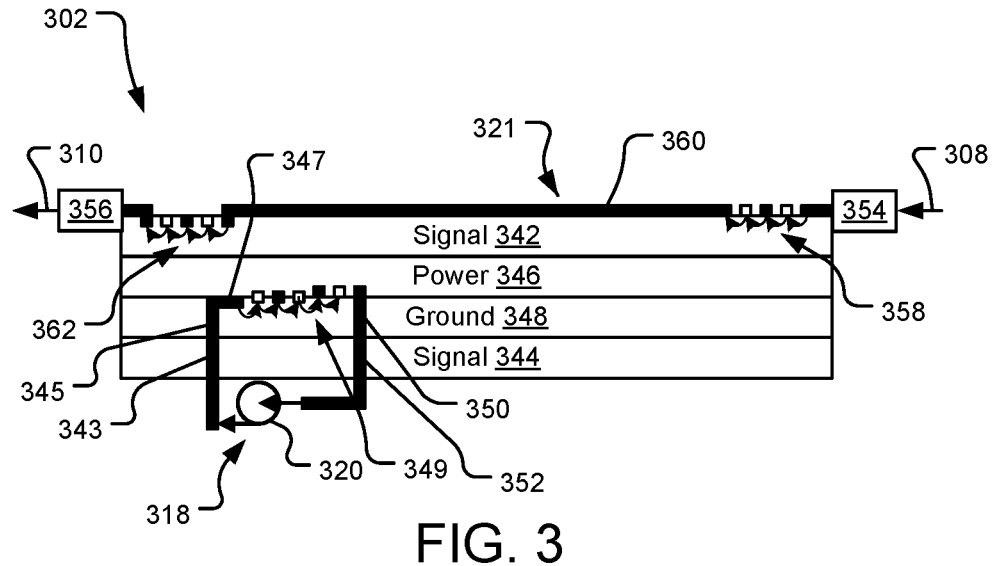
FIG. 3 illustrates a partial elevation section view of an example microfluidic PCB with both an internal closed coolant loop and an external coolant path.

FIG. 3 illustrates a partial elevation section view of an example microfluidic PCB 302 with both an internal closed coolant loop 318 and an external coolant path 321. FIG. 3 illustrates a 4-layer PCB stack-up, with outside signal layers 342, 344 and an interior power layer 346 and an interior ground layer 348. Other implementations may adopt a different arrangement or number of layers within a PCB. The presently disclosed microfluidic cooling channels may occupy any one or more of the PCB layers 342, 344, 346, 348 or any one or more layers of another PCB stack-up with greater or fewer layers than the depicted 4-layer PCB stack-up. The PCB 302 is illustrated as utilizing either or both sides of any of the PCB layers 342, 344, 346, 348 for routing the microfluidic cooling channels, including micro-fluidic vias to pass the microfluidic cooling channels through the PCB layers 342, 344, 346, 348. In other implementa-tions, only one side of the PCB layers 342, 344, 346, 348 contains the microfluidic cooling channels, while the other side of the PCB layers 342, 344, 346, 348 is used for electrical traces.

In FIG. 3, the microfluidic channels are illustrated con-ceptually by thick solid black lines and filled and un-filled squares. The thick solid black lines illustrate microfluidic channels traversing across the PCB 302 in directions parallel to the depicted view, while filled squares microfluidic chan-nels traversing across the PCB 302 into the depicted view, and un-filled squares microfluidic channels traversing across the PCB 302 out of the depicted view. While only these options are illustrated, in practice, the microfluidic channels can extend in any direction across any of the PCB layers 342, 344, 346, 348 and through any of the PCB layers 342, 344, 346, 348. Further, the electrical traces and electronic components are omitted from view in FIG. 3 for clarity, but are assumed to be present, as shown in FIGS. 1 and 2, for example.

The internal closed coolant loop 318 includes a pump 320 mounted to the signal layer 344 that serves to circulate coolant fluid through the microfluidic channels. The internal closed coolant loop 318 serves to cool any number and placement of heat-generating components (e.g., a micropro-cessors) within the PCB 302. The internal closed coolant loop 318 runs from the pump 320, through microfluidic vias 343, 345 in layers 344, 348, respectively, through a channel 347 formed in a recess of the ground layer 348 (e.g., via etching or mechanical removable of material from the ground layer 348 substrate), back-and-forth (in and out of the depicted view) across the ground layer 348 and the power layer 346, with a series of arrows 349 indicating that the channel remains connected out of view.

The internal closed coolant loop 318 is illustrated in various positions (e.g., fully within the ground layer 348, within both the ground layer 348 and the power layer 346, and fully within the power layer 346) as it traverses back-and-forth across the PCB 302 to illustrate that the internal closed coolant loop 318 may occupy recesses in either or both of the ground layer 348 and the power layer 346, as well as be applied over the top of either or both of the ground layer 348 and the power layer 346. Microfluidic channels occupying space on either or both of the signal layers 342, 344 may be similarly situated within recesses within a layer and/or applied over a layer surface. After traversing back-and-forth across the ground layer 348 and the power layer 346 (e.g., beneath an electronic component to maximize thermally conductive contact area with the electronic component), the internal closed coolant loop 318 runs through microfluidic vias 350, 352 in layers 348, 344, respectively, and back to the pump 320, thereby completing the closed cooling loop.

The external coolant path 321 receives an input flow of coolant or pressurized coolant supply (illustrated by arrow 308) at coolant inlet port 354, which is mounted to the signal layer 342 and that serves to pass coolant fluid through the microfluidic channels to a coolant outlet port 356, where the coolant outputs the external coolant path 321 (illustrated by arrow 310) at a coolant return. The external coolant path 321 serves to cool any number and placement of heat-generating components (e.g., a microprocessors) within the PCB 302. The external coolant path 321 runs from the coolant inlet port 354, back-and-forth (in and out of the depicted view) across an exterior surface of the signal layer 342, with a series of arrows 358 indicating that the channel remains connected out of view. The external coolant path 321 further runs through a channel 360 applied over the of the signal layer 342 (e.g., via deposition to build the channel or attachment of a pre-formed channel) to another back-and-forth section (in and out of the depicted view) recessed within the exterior surface of the signal layer 342 and with another series of arrows 362 indicating that the channel remains connected out of view, and out of the external coolant path 321 via the coolant outlet port 356.

The external coolant path 321 is illustrated as both fully recessed within the signal layer 342 (see arrows 362) and applied over the top of the signal layer 342 (see arrows 358 as it traverses back-and-forth across the PCB 302 to illustrate that the external coolant path 321 may occupy recesses in the signal layer 342, as well as be applied over the top of the signal layer 342, or a combination between. Microfluidic channels occupying space on either or both of the power layer 346 and the ground layer 348 may be similarly situated within recesses within a layer and/or applied over a layer surface.

In some implementations, a heat exchanger is also mounted to or within the PCB 302 and is in-line with the internal closed coolant loop 318 and/or the external coolant path 321 to remove thermal energy from the circulating coolant, though such a heat exchanger is not illustrated in FIG. 3. The internal closed coolant loop 318 is a closed-loop with no coolant reservoir, though other implementations may be open-loop with a coolant reservoir (see e.g., FIG. 1). The external coolant path 321 is illustrated as an open path, though it may also be configured as an open or closed loop with other external components, such as a pump, heat exchanger, reservoir, etc. Though both the internal closed coolant loop 318 and the external coolant path 321 are illustrated in FIG. 3 on the same PCB 302, other implementations may only utilize one or the other on a singular PCB 302. For both the internal closed coolant loop 318 and the external coolant path 321, the circulated or flowing coolant may be any low-viscosity fluid that can effectively be circulated or flowed through the series of microfluidic channels.

The series of microfluidic channels found in both the internal closed coolant loop 318 and the external coolant path 321 run adjacent heat-generating components (not shown, see e.g., components 218, 219 and traces 236, 238 of FIG. 2) mounted on or within the PCB 302 and makes thermally conductive contact with the heat-generating components or runs close enough to the heat-generating components to effectively transfer thermal energy from the heat-generating components to coolant flowing through the microfluidic channels. While the series of microfluidic channels are thermally conductive with the heat-generating components, the network of microfluidic passages are electrically isolated from the heat-generating components and other electrical components of the PCB 302, including ground traces, power traces, and signal traces, for example.

In some implementations, the internal closed coolant loop 318 and/or the external coolant path 321 may occupy a substantial portion (i.e., greater than 50%) or substantially all (i.e., greater than 90%) of the available surface area of either or both sides of one of the layers 342, 344, 346, 348 within the PCB 302. In such implementations, the microfluidic cooling channels may take a variety of forms, such as a snake-pattern, grid-pattern, etc. As a result, the entire layer (or a substantial portion thereof) is turned into a cooling structure for the PCB 302 overall.

In an example implementation, the PCB 302 is a 4-layer PCB, as shown, with each the substrate of each of the layers 342, 344, 346, 348 being FR-4 glass-reinforced epoxy laminate. While varying widely by application, the PCB 302 may be 50 mm×50 mm and 1.6 mm thick (approximately 0.4 mm for each of the layers 342, 344, 346, 348). The PCB 302 may include a variety of heat-generating components, such as voltage regulators (buck/boost regulators), resistors, drivers, and high-current traces and vias (e.g., high-speed, high-current signal traces/vias). The signal traces (not shown, see e.g., traces 216, 236, 238) of FIG. 2) may have a thickness of 7-12 mil (0.007-0.012 inch) and are spaced at least 1 mil (0.001 inch) from other traces or electrical components of the PCB 302. The microfluidic cooling channels that comprise the internal closed coolant loop 318 and/or the external coolant path 321 may have similar spacing from the traces and electrical components of the PCB 302 to provide electrical isolation, but may not be much further away (e.g., less than 10 mil (0.01 inch) to provide effective thermal conductivity. Further, the microfluidic cooling channels themselves may have an internal diameter of approximately 28 mil (0.028) or 7-40 mil (0.007-0.040 inch) or less than 40 mil (less than 0.040 inch).

FIG. 4 illustrates example operations 400 for a method of manufacturing a microfluidic PCB. A providing operation 405 provides a planar substrate forming a mechanical base for a top layer of the PCB. In various implementations the PCB substrate includes ceramics, fiberglass, plastics, or any combination thereof. Further, the PCB substrate may be an FR-1 through FR-6 material, a G-10 or G-11 material, a CEM-1 through CEM-5 material, PTFE, PTFE composite, RF-35, aluminum or other metal core board (i.e., insulated metal substrate), alumina, polyimide foil, and polyimidefluoropolymer composite foil. The planar substrate is laminated with copper and etched on one or both sides of the planar substrate to form a top network of traces (or conductive metallic paths) for the PCB.

A first create and attach operation 410 attaches a first mid-layer of the PCB to the top layer of the PCB. The first mid-layer may include a similar planar substrate that is laminated with copper and etched on one or both sides of the planar substrate to form a first middle network of traces (or conductive metallic paths) for the PCB. A second create and attach operation 415 attaches a second mid-layer to the first mid-layer of the PCB. The second mid-layer may include a similar planar substrate that is laminated with copper and etched on one or both sides of the planar substrate to form a second middle network of traces (or conductive metallic paths) for the PCB. A third create and attach operation 420 attaches a bottom layer to the second mid-layer of the PCB. The bottom layer may include a similar planar substrate that is laminated with copper and etched on one or both sides of the planar substrate to form a bottom network of traces (or conductive metallic paths) for the PCB. In various implementations, the top layer, the first mid-layer, the second mid-layer, and the bottom layer are each one of a ground layer, a power layer, and a signal layer. Other implementations may include greater or fewer total layers, omit a ground layer, power layer, and/or signal layer, or provide additional layers of a different type.

A pick-and-place operation 425 attaches additional electronic or other components (e.g., resistors, capacitors, integrated circuits, and SOCs) onto one or both exterior sides of the PCB. Some or all of these components may be heat-generating components. The additional electronic components or other components may be interference fit, soldered, adhered, and/or mechanically fastened, for example.

A drilling operation 430 drills mechanical, electrical and/or coolant vias through one or more of the PCB layers. The mechanical vias provide mounting locations for the PCB. The electrical vias serve to electrically connect traces and other electrical components across two or more of the top layer, the first mid-layer, the second mid-layer, and the bottom layer. Similarly, the coolant vias connect the network of microfluidic passages across two or more of the top layer, the first mid-layer, the second mid-layer, and the bottom layer. In some implementations, the drilled electrical and/or coolant vias are subsequently coated. In the case of electrical vias, the coating may be metal plating to provide electrical conductivity. In the case of coolant vias, the coating may provide sealing against leaks of the coolant.

An applying operation 435 applies a network of microfluidic passages to one or more of the ground layer, the power layer, and the signal layer and in thermally conductive contact with the heat-generating components. The microfluidic passages are spaced close enough to the heat-generating components to conduct thermal energy therefrom, but far enough to be electrically isolated from the top, first middle, second middle, and bottom traces.

The providing operation 405, create and attach operations 410, 415, 420, drilling operation 430, and applying operation 435 may each include sets of subtractive, additive, and/or semi-additive processes. In a subtractive process, the PCB substrate starts with one or both planar surfaces entirely coated with metal (e.g., copper). Areas of the metal are removed from the PCB substrate leaving a network of conductive paths (traces) and pads remaining. Similarly, areas of each substrate may be removed to form recessed channels or vias for the network of microfluidic passages. In an additive process, the network of conductive paths and pads is electroplated onto an uncoated PCB substrate. Similarly, the network of microfluidic passages may be deposited onto or attached to PCB substrate surfaces. In a semi-additive process, the PCB substrate contains a thin coating of metal on one or both of the planar surfaces of the PCB. A reverse mask is applied to the PCB substrate where additional metal plating is added to unmasked areas of the PCB. The mask is stripped away, and any remaining thin areas of copper are stripped away, resulting in the network of conductive paths and pads remaining. Similarly, the network of microfluidic passages may be deposited onto or attached to the PCB within channels formed in the PCB substrate. As such, the applying operation 435 may be performed repeatedly during and between the providing operation 405, create and attach operations 410, 415, 420, and drilling operation 430, as illustrated in FIG. 4.

A connecting operation 440 connects a microfluidic pump in line with the network of microfluidic passages. The microfluidic pump may be internal and mounted on the PCB itself or external to the PCB. Further, the network of microfluidic passages may be a closed loop with coolant sealed therein or an open loop with the open to add or remove coolant as needed. A testing operation 445 tests operation of the microfluidic PCB by flowing a coolant fluid through the network of microfluidic passages to test the integrity of the coolant passages and check for any leaks or low/no flow conditions. This test is done prior to completing manufacture of the microfluidic PCB and prior to placing the microfluidic PCB in service to cool heat-generating component(s) on the PCB and/or or the PCB overall.

The operations making up the embodiments of the invention described herein are referred to variously as operations, steps, objects, or modules. The operations may be performed in any order, adding or omitting operations as desired, unless explicitly claimed otherwise or a specific order is inherently necessitated by the claim language.

An example implementation of the presently disclosed technology includes a microfluidic printed circuit board (PCB). The PCB may include a ground layer including a network of ground traces, a power layer including a network of power traces, a signal layer including a network of signal traces, a heat-generating component attached to the microfluidic PCB, and a network of microfluidic passages. The network of microfluidic passages may be applied to one or more of the ground layer, the power layer, and the signal layer and in thermally conductive contact with the heat-generating component. The network of microfluidic passages may be electrically isolated from the ground traces, power traces, and signal traces.

In some implementations, the network of microfluidic passages is formed within recesses of a surface of one or more of the ground layer, the power layer, and the signal layer.

In some implementations, the network of microfluidic passages is applied over a surface of one or more of the ground layer, the power layer, and the signal layer.

The microfluidic PCB may further comprise a microfluidic pump connected in line with the network of microfluidic passages. The microfluidic pump is to flow a coolant fluid through the network of microfluidic passages to cool the heat-generating component.

In some implementations, the network of microfluidic passages forms a closed loop, and the microfluidic pump circulates the coolant fluid through the network of microfluidic passages.

In some implementations, the microfluidic pump is mounted to the printed circuit board.

In some implementations, the microfluidic pump is external to the printed circuit board.

The microfluidic PCB may further comprise a pressurized coolant supply connected to an input to the network of microfluidic passages and a coolant return connected to an output of the network of microfluidic passages.

In some implementations, the heat-generating component is a high-current electrical trace and a portion of the network of microfluidic passages runs parallel and adjacent to the high-current electrical trace.

In some implementations, the heat-generating component is a discrete device mounted to a surface of the microfluidic PCB. A portion of the network of microfluidic passages encircles the heat-generating component.

In some implementations, a portion of the network of microfluidic passages runs beneath the heat-generating component.

In some implementations, the network of microfluidic passages occupies a substantial portion of available surface area of either or both sides of one of the ground layer, the power layer, and the signal layer.

In some implementations, the network of microfluidic passages includes passages less than 40 mil (0.007-0.040 inch) in diameter.

The microfluidic PCB may further comprise a heat exchanger connected in line with the network of microfluidic passages. The heat exchanger is to dissipate thermal energy from a coolant fluid flowing through the network of microfluidic passages.

In some implementations, the heat exchanger is one of mounted to the printed circuit board and external to the printed circuit board.

In some implementations, the network of microfluidic passages includes coolant vias that connect two or more of the ground layer, the power layer, and the signal layer.

Another example implementation of the presently disclosed technology includes a method of manufacturing a microfluidic printed circuit board (PCB). The method may comprise providing a top layer including a top network of traces; attaching a first mid-layer including a first middle network of traces; attaching a second mid-layer including a second middle network of traces; attaching a bottom layer including a bottom network of traces, wherein the top layer, the first mid-layer, the second mid-layer, and the bottom layer are each one of a ground layer, a power layer, and a signal layer; attaching a heat-generating component to the microfluidic PCB; and applying a network of microfluidic passages to one or more of the ground layer, the power layer, and the signal layer and in thermally conductive contact with the heat-generating component, the network of microfluidic passages electrically isolated from the top, first middle, second middle, and bottom traces.

The method may further comprise connecting a microfluidic pump in line with the network of microfluidic passages, the microfluidic pump; and flowing a coolant fluid through the network of microfluidic passages to cool the heat-generating component.

The method may further comprise drilling coolant vias that connect the network of microfluidic passages across two or more of the top layer, the first mid-layer, the second mid-layer, and the bottom layer.

Another example implementation of the presently disclosed technology includes a printed circuit board comprising: a ground layer including a network of ground traces; a power layer including a network of power traces; a signal layer including a network of signal traces; a heat-generating component attached to the printed circuit board; a closed-loop network of microfluidic passages applied to one or more of the ground layer, the power layer, and the signal layer and in thermally conductive contact with the heat-generating component, the network of microfluidic passages electrically isolated from the ground traces, power traces, and signal traces; and a microfluidic pump placed within the closed-loop network and attached to the printed circuit board, the microfluidic pump to circulate a coolant fluid through the network of microfluidic passages to cool the heat-generating component.

The above specification, examples, and data provide a complete description of the structure and use of exemplary embodiments of the invention. Since many embodiments of the invention can be made without departing from the spirit and scope of the invention, the invention resides in the claims hereinafter appended. Furthermore, structural features of the different embodiments may be combined in yet another embodiment without departing from the recited claims.

What is claimed is:

1. A microfluidic printed circuit board (PCB) comprising:
a ground layer including a first network of traces;
a power layer including a second network of traces;
a signal layer including a third network of traces;
a heat-generating component attached to the microfluidic PCB; and
a network of microfluidic passages formed in one or more of the ground layer, the power layer, and the signal layer and in thermally conductive contact with the heat-generating component, the network of microfluidic passages electrically isolated from the first network of traces, the second network of traces, and the third network of traces.

2. The microfluidic PCB of claim 1, wherein the network of microfluidic passages is formed within recesses of a surface of one or more of the ground layer, the power layer, and the signal layer.

3. The microfluidic PCB of claim 1, wherein the network of microfluidic passages is applied over a surface of one or more of the ground layer, the power layer, and the signal layer.

4. The microfluidic PCB of claim 1, further comprising:
a microfluidic pump connected in line with the network of microfluidic passages, the microfluidic pump to flow a coolant fluid through the network of microfluidic passages to cool the heat-generating component.

5. The microfluidic PCB of claim 4, wherein the network of microfluidic passages forms a closed loop, and the microfluidic pump circulates the coolant fluid through the network of microfluidic passages.

6. The microfluidic PCB of claim 4, wherein the microfluidic pump is mounted to the microfluidic PCB.

7. The microfluidic PCB of claim 4, wherein the microfluidic pump is external to the microfluidic PCB.

8. The microfluidic PCB of claim 1, further comprising:
a pressurized coolant supply connected to an input to the network of microfluidic passages; and
a coolant return connected to an output of the network of microfluidic passages.

9. The microfluidic PCB of claim 1, wherein the heat-generating component is an electrical trace and a portion of the network of microfluidic passages runs parallel and adjacent to the electrical trace.

10. The microfluidic PCB of claim 1, wherein the heat-generating component is a discrete device mounted to a surface of the microfluidic PCB, wherein a portion of the network of microfluidic passages encircles the heat-generating component.

11. The microfluidic PCB of claim 1, wherein a portion of the network of microfluidic passages runs beneath the heat-generating component.

12. The microfluidic PCB of claim 1, wherein the network of microfluidic passages occupies a substantial portion of available surface area of either or both sides of one of the ground layer, the power layer, and the signal layer.

13. The microfluidic PCB of claim 1, wherein the network of microfluidic passages includes passages less than 40 mil (0.007-0.040 inch) in diameter.

14. The microfluidic PCB of claim 1, further comprising: a heat exchanger connected in line with the network of microfluidic passages, the heat exchanger to dissipate thermal energy from a coolant fluid flowing through the network of microfluidic passages.

15. The microfluidic PCB of claim 14, wherein the heat exchanger is one of:

mounted to the printed circuit board; and
external to the printed circuit board.

16. The microfluidic PCB of claim 1, wherein the network of microfluidic passages includes coolant vias that connect two or more of the ground layer, the power layer, and the signal layer.

17. A method of manufacturing a microfluidic printed circuit board (PCB) comprising:

providing a top layer including a top network of traces;
attaching a first mid-layer including a first middle network of traces;
attaching a second mid-layer including a second middle network of traces;
attaching a bottom layer including a bottom network of traces, wherein the top layer, the first mid-layer, the second mid-layer, and the bottom layer are each one of a ground layer, a power layer, and a signal layer;
attaching a heat-generating component to the microfluidic PCB; and

forming a network of microfluidic passages in one or more of the ground layer, the power layer, and the signal layer and in thermally conductive contact with the heat-generating component, the network of microfluidic passages being electrically isolated from the top network of traces, the first middle network of traces, the second middle network of traces, and bottom network of traces.

18. The method of manufacturing a microfluidic PCB of claim 17, further comprising:

connecting a microfluidic pump in line with the network of microfluidic passages, the microfluidic pump; and
flowing a coolant fluid through the network of microfluidic passages to cool the heat-generating component.

19. The method of manufacturing a microfluidic PCB of claim 17, further comprising:

drilling coolant vias that connect the network of microfluidic passages across two or more of the top layer, the first mid-layer, the second mid-layer, and the bottom layer.

20. A printed circuit board comprising:

a ground layer including a first network of traces;
a power layer including a second network of traces;
a signal layer including a third network of traces;
a heat-generating component attached to the printed circuit board;
a closed-loop network of microfluidic passages formed in one or more of the ground layer, the power layer, and the signal layer and in thermally conductive contact with the heat-generating component, the network of microfluidic passages being electrically isolated from the first network of traces, the second network of traces, and the third network of traces; and
a microfluidic pump placed within the closed-loop network and attached to the printed circuit board, the microfluidic pump to circulate a coolant fluid through the network of microfluidic passages to cool the heat-generating component.

* * * * *